(12) United States Patent
Ogata

(10) Patent No.: US 6,593,179 B2
(45) Date of Patent: *Jul. 15, 2003

(54) METHOD OF MANUFACTURING A SEMICONDUCTOR DEVICE

(75) Inventor: Tamotsu Ogata, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/553,331

(22) Filed: Apr. 20, 2000

(65) Prior Publication Data

US 2003/0113965 A1 Jun. 19, 2003

(30) Foreign Application Priority Data

Nov. 18, 1999 (JP) .............................. 11-328469

(51) Int. Cl.[7] ..................... H01L 21/8242; H01L 21/302
(52) U.S. Cl. ..................... 438/239; 438/756; 438/757
(58) Field of Search ................ 438/239, 250, 438/254, 745, 749, 756, 757, 735, 737, 738, 743, 744

(56) References Cited

U.S. PATENT DOCUMENTS 3,657,030 A * 4/1972 Porter ..................... 438/703
5,094,979 A * 3/1992 Kusano ..................... 438/652

FOREIGN PATENT DOCUMENTS

| JP | 3-219631 A | * | 9/1991 | ......... H01L/21/316 |
| JP | 9-246376 | | 9/1997 | |
| JP | 11-97522 A | * | 1/1999 | ........... H01L/21/76 |
| JP | 11-204492 A | * | 7/1999 | ......... H01L/21/306 |

OTHER PUBLICATIONS

Wolf, "Silicon Processing for the VLSI ERA—vol. 1: Process Technology", 1986, pp. 522, 526–535, 539–542, 551–556.*

LSI Handbook, p. 264 (published by Oak Co., 1984).*

* cited by examiner

*Primary Examiner*—Matthew Smith
*Assistant Examiner*—Lex H. Malsawma
(74) *Attorney, Agent, or Firm*—McDermott, Will & Emery

(57) ABSTRACT

An isolation oxide film is formed on a silicon substrate, and a pad oxide film is formed in an active region. A lower electrode of a capacitor is formed on the isolation oxide film, and a multilayered film (ON film) comprising a silicon oxide film and a silicon nitride film is formed on the lower electrode. A mask oxide film is formed on the ON film so as to cover only the area in the vicinity of the lower electrode. The ON film is patterned by means of wet etching capable of selectively removing the silicon nitride film. The pad oxide film and the mask oxide film are removed before forming a gate oxide film. Fabrication of a capacitor and a transistor is completed by formation of gate electrodes and an upper electrode.

5 Claims, 7 Drawing Sheets

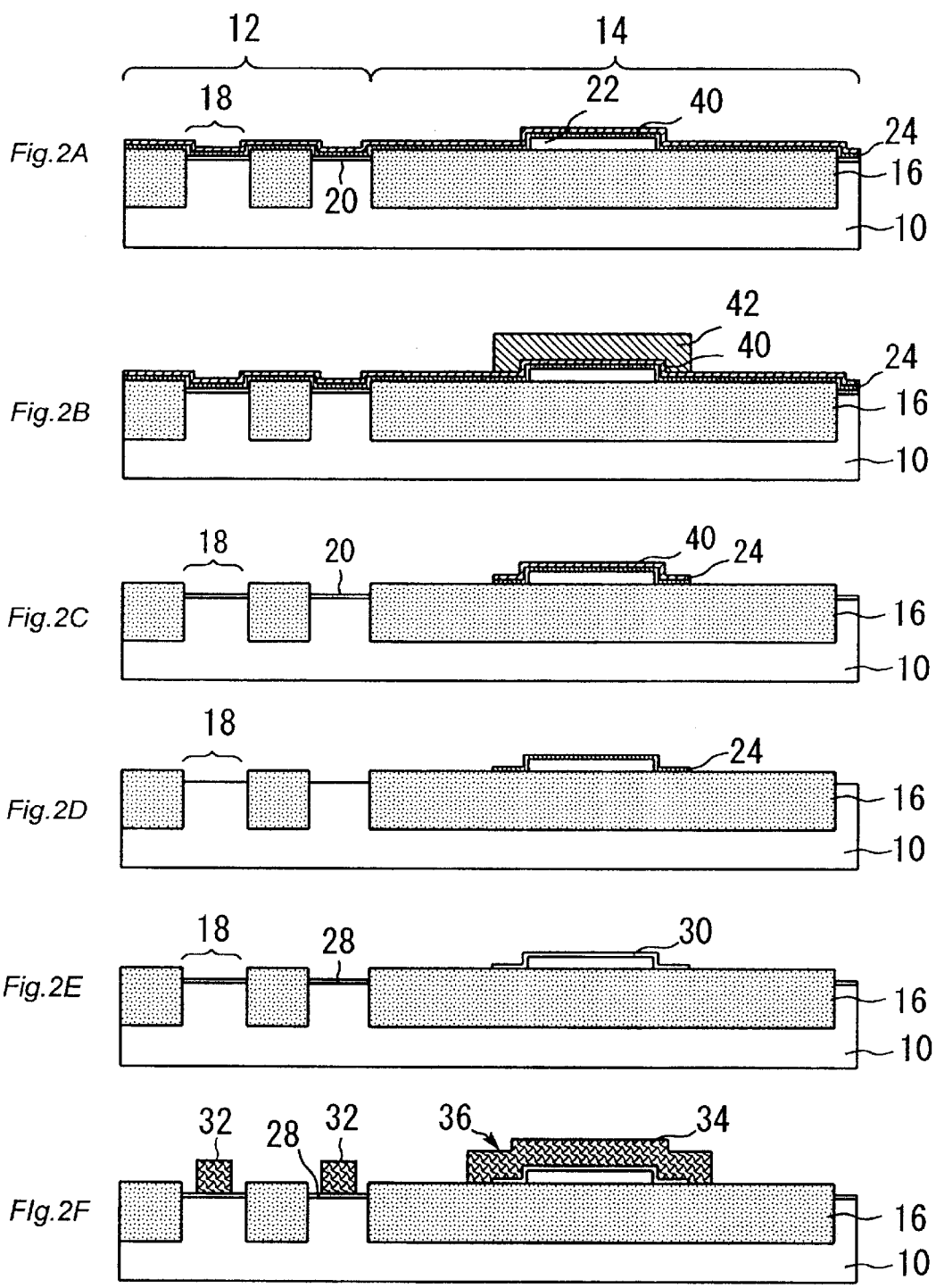

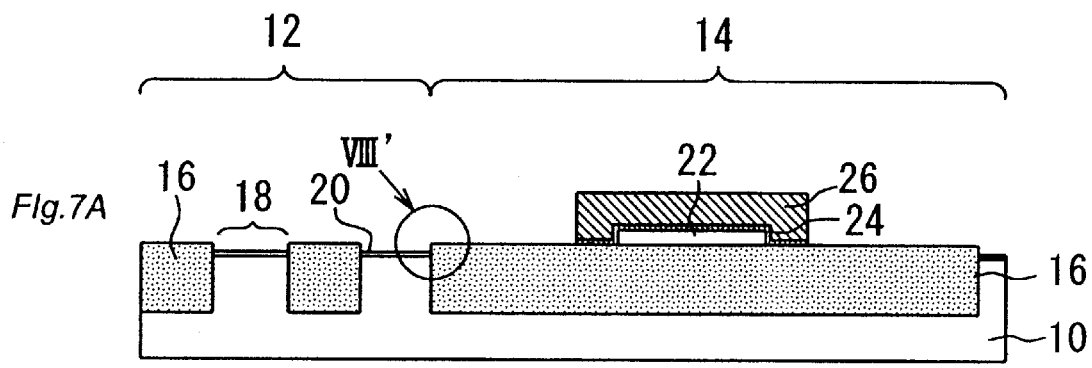
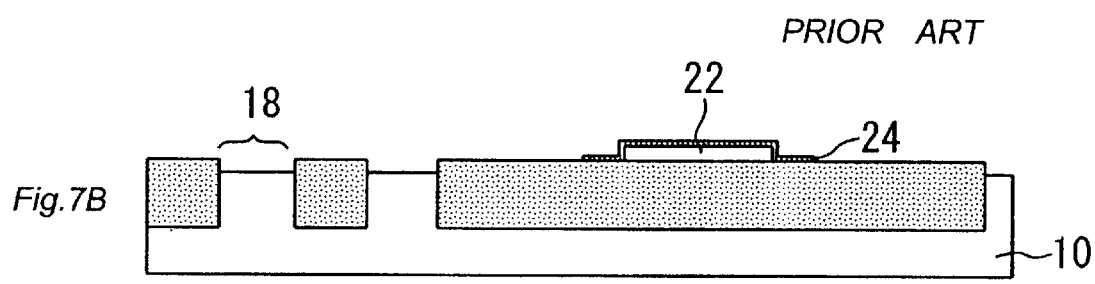
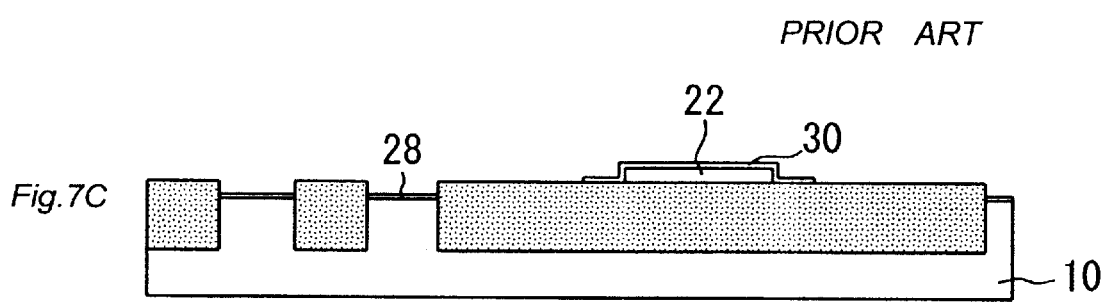
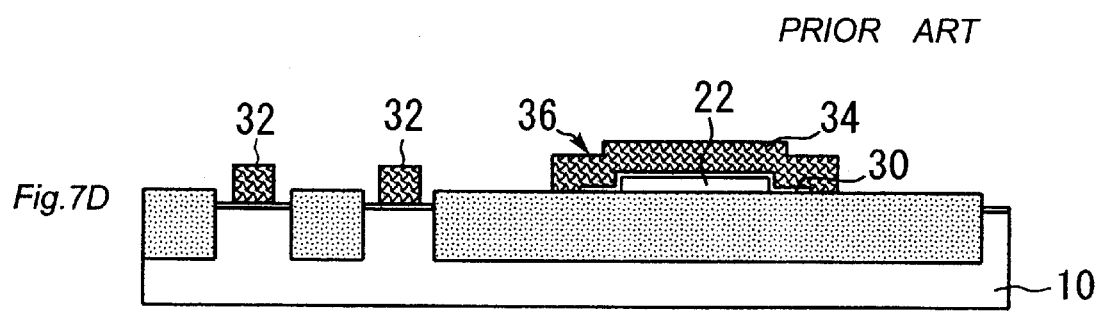

METHOD OF MANUFACTURING A SEMICONDUCTOR DEVICE

BACKGROUND OF THE INVENTION

1. Field of the Invention

The present invention relates to a method of manufacturing a semiconductor device, and more particularly, to a method of manufacturing a semiconductor device suitable for manufacturing a system LSI equipped with analog circuitry including a capacitor.

2. Description of the Background Art

A capacitor—which comprises a lower electrode formed from polysilicon, a dielectric film formed on the lower electrode, and an upper electrode which is formed from polysilicon and on the dielectric film (i.e., a so-called "poly-poly capacitor")—is used for an analog circuit included in a system LSI. A multilayered film comprising a silicon oxide film, a silicon nitride film, and a silicon oxide film in the sequence given (hereinafter referred to as an "ONO film") is used for the poly-poly capacitor.

FIGS. 6A to 6C and FIGS. 7A to 7D are cross-sectional views for describing a portion of the steps for manufacturing a system LSI equipped with a poly-poly capacitor. The drawings show that a transistor fabrication region 12 and a capacitor fabrication region 14 are formed in a silicon substrate 10.

As shown in FIG. 6A, an isolation oxide film 16 is formed in the silicon substrate 10 during manufacturing processes. In the case of a device in which miniaturization is pursued to a greater extent, the isolation oxide film 16 is formed through a so-called "shallow-trench process." According to the shallow trench process, shallow trenches are first formed in the silicon substrate 10, and an oxide film is embedded in the thus-formed shallow trenches, thereby forming the isolation oxide film 16. Within the transistor fabrication region 12, an active region 18 is formed in an area enclosed by the isolation oxide film 16. A pad oxide film 20 is formed on the surface of the active region 18 during the course of formation of the isolation oxide film 16.

As shown in FIG. 6B, a lower electrode 22 is formed from polysilicon in the capacitor fabrication region 14. During the process of forming the lower electrode 22, polysilicon is deposited on the silicon substrate 10 by means of the low-pressure CVD technique. Subsequently, the thus-deposited polysilicon is patterned into the shape of the lower electrode 22 by means of photolithography and dry etching.

As shown in FIG. 6C, a multilayered film 24 comprising a silicon oxide film and a silicon nitride film (hereinafter referred to as an "ON film 24") is formed on the lower electrode 22. During the process of forming the ON film 24, a silicon oxide film is grown over the upper surface of the lower electrode 22 or the overall surface of the silicon substrate 10, and a silicon nitride film is formed on the silicon oxide film. The silicon oxide film can be formed, for example, by means of thermally oxidizing the surface of polysilicon of the lower electrode 22 or through deposition of oxides by means of the low-pressure CVD technique while dichlorosilane ($SiH_2Cl_2$) and nitrous oxide ($N_2O$) are used as source materials.

As shown in FIG. 7A, the ON film 24 is patterned into such a shape as to cover only the vicinity of the lower electrode 22. The ON film 24 is patterned through dry etching while a photoresist film 26 is taken as a mask. At this time, the pad oxide film 20 covering the surface of the active region 18 acts as a protective film for protecting silicon located in the active region 18 from etching gas.

As shown in FIG. 7B, the photoresist film 26 covering the ON film 24 and the pad oxide film 20 located in the active region 18 are removed after completion of patterning of the ON film 24. The pad oxide film 20 can be removed by means of wet etching of the entire surface of the silicon substrate 10 through use of HF. The photoresist film 26 is removed prior to removal of the pad oxide film 20. In this case, although the ON film 24 is also exposed to HF, the nitride film covering the surface of the ON film 24 is less likely to be etched by HF. Accordingly, the ON film 24 is prevented from being etched to a great extent during the wet etching process.

As shown in FIG. 7C, a gate oxide film 28 is formed on the surface of the active region 18 by thermal oxidation of the surface of the silicon substrate 10. At this time, the surface of the ON film 24; that is, a nitride film, is lightly oxidized, whereupon the ON film 24 becomes an ONO film 30.

As shown in FIG. 7D, gate electrodes 32 are formed from polysilicon on the gate oxide film 28, and an upper electrode 34 is formed from polysilicon on the ONO film 30. The gate electrodes 32 and the upper electrode 34 are formed by deposition of polysilicon on the entire surface of the silicon substrate 10 by means of the low-pressure CVD technique, and by means of patterning the polysilicon into a desired pattern through photolithography and dry etching.

Through a round of the processing operations, a poly-poly capacitor 36 is fabricated in the capacitor fabrication region 14. A source-drain region is formed in the active region 18 by means of a known technique, whereby a transistor is fabricated in the transistor fabrication region 12.

The problems involved in the semiconductor device manufacturing method just described will now be described by reference to FIGS. 8A to 8C. FIG. 8A is an enlarged view showing a portion of the semiconductor substrate designated by VIII in FIG. 6C, and FIGS. 8B and 8C are enlarged views showing possible configuration of a portion VIII' shown in FIG. 7A.

In a system LSI containing a poly-poly capacitor, there may be a case where the isolation oxide film 16 is formed so as to protrude from the surface of the active region 18 in order to ensure insulation. Reference symbol $T_{IO}$ shown in FIG. 8A designates the height of such a protuberance. For convenience sake, it is assumed that the height $T_{IO}$ of the protuberance has a value of 500 angstroms. In FIG. 8A, reference symbol $T_{pad}$ designates the thickness of the pad oxide film 20, and $T_{ON}$ designates the vertical thickness of the ON film 24.

As mentioned above, the ON film 24 is patterned through dry etching while the photoresist film 26 is taken as a mask (see FIG. 7A). Since dry etching involves anisotropy, the overall thickness of the ON film 24 is substantially uniformly diminished during the dry etching process.

As shown in FIG. 8A, in a boundary between the active region 18 and the isolation oxide film 16, the thickness $T_{ON}$ of the ON film 24 becomes greater than the thickness of the remaining portion thereof, by only the height $T_{IO}$ of the protuberance of the isolation oxide film 16. As shown in FIG. 8B, at a point in time at which the isolation oxide film 16 and the active region 18 have become exposed during the dry etching process, an ON residue 38 having a thickness $T_{IO}$ (i.e., 500 angstroms) is present in the boundary. In order to remove the ON residue 38, there must be performed over-etching for removing the ON film 24 by a thickness of 500 angstroms, after the isolation oxide film 16 and the active region 18 have been exposed.

In some cases, a sufficient nitride film/oxide film etch selectivity cannot be obtained, depending on a system or requirements employed for manufacturing a semiconductor. Given that the etch selectivity assumes a value of 2, the isolation oxide film 16 and the pad oxide film 20 are removed by 250 angstroms during the over-etching process for removing 500 angstroms of the ON residue 38. Consequently, as shown in FIG. 8C, the upper surface of the isolation oxide film 16 is significantly receded, and the thickness $T_{pad}$ of the pad oxide film 20 is significantly diminished (or disappears).

If the upper surface of the isolation oxide film 16 is receded greatly, there may arise a problem of deteriorating the reliability of the gate oxide film 28 (see FIG. 7C) formed on the active region 18, or a problem of an increase in the amount of junction leakage of the transistor. If the thickness of the pad oxide film 20 is diminished during the course of the over-etching process, the silicon of the active region 18 becomes likely to suffer a damage by an etching gas. As a result, the reliability of the gate oxide film 28 formed in the active region 18 is deteriorated to a much greater extent.

Recession of the isolation oxide film 16 or a decrease in the thickness of the pad oxide film 18 can be prevented by diminishing the extent of over-etching. However, if the extent of over-etching is diminished, the wafer is required to be subjected to HF processing (i.e., wet etching) for removing the pad oxide film 20 while the ON residue 38 remains on the pad oxide film 20. In this case, the ON residue 38 may be put off from the wafer during the process of HF processing, thus resulting in the presence of a extraneous matter, which would cause a failure.

As mentioned above, the manufacturing method of background art causes a drawback of deteriorating the reliability of a semiconductor device even when the ON film 24 is sufficiently over-etched or when the extent to which the ON film 24 is over-etched is diminished.

SUMMARY OF THE INVENTION

The present invention has been conceived to solve such a drawback and is aimed at providing a method of manufacturing a semiconductor device including a poly-poly capacitor, without involvement of recession of the upper surface of an isolation oxide film, damage to silicon of an active region, or generation of extraneous matter, which would otherwise be caused by an ON residue.

The above objects of the present invention are achieved by a method of manufacturing a semiconductor device including a transistor and a capacitor, both being formed in a single substrate. In the method, an isolation oxide film is formed on a silicon substrate. A pad oxide film is formed on an active region of the silicon substrate. A lower electrode of the capacitor is formed on the isolation oxide film. A silicon nitride film is formed on entire surface of the silicon substrate so as to cover the lower electrode. A mask is formed on the silicon nitride film so as to cover only the area in the vicinity of the lower electrode. The silicon nitride film is patterned through use of the mask by means of wet etching capable of selectively removing a silicon nitride film. The pad oxide film is removed through wet etching capable of selectively removing silicon oxide, after patterning of the silicon nitride film. A gate oxide film is formed on the active region, after removal of the pad oxide film. A gate electrode is formed on the gate oxide film. Finally, an upper electrode of the capacitor is formed on the patterned silicon nitride film.

Other objects and further features of the present invention will be apparent from the following detailed description when read in conjunction with the accompanying drawings.

BRIEF DESCRIPTION OF THE DRAWINGS

FIGS. 1A to 1C and FIGS. 2A to 2F are cross-sectional views for describing a method of manufacturing a semiconductor device according to a first embodiment of the present invention;

FIGS. 6A to 6C and FIGS. 7A to 7D are cross-sectional views for describing a conventional method of manufacturing a semiconductor device.

DESCRIPTION OF THE PREFERRED EMBODIMENTS

Figure 1A:
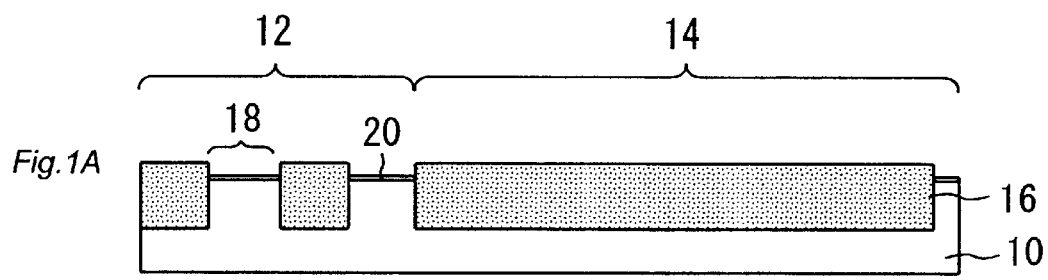

In the following, principles and embodiments of the present invention will be described with reference to the accompanying drawings. The members and steps that are common to some of the drawings are given the same reference numerals and redundant descriptions therefor may be omitted.

Embodiment 1

Figure 1B:
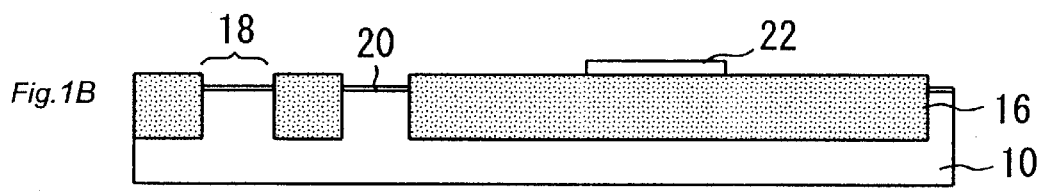
Figure 1C:
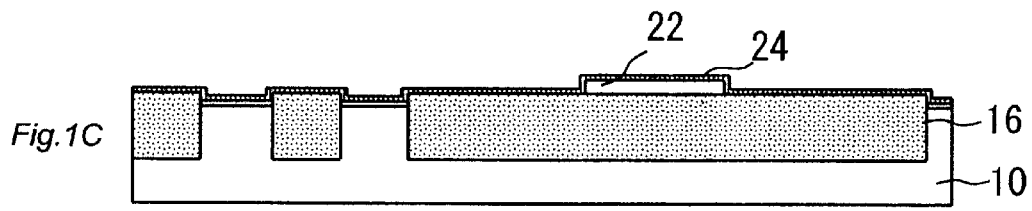
Figure 6A:
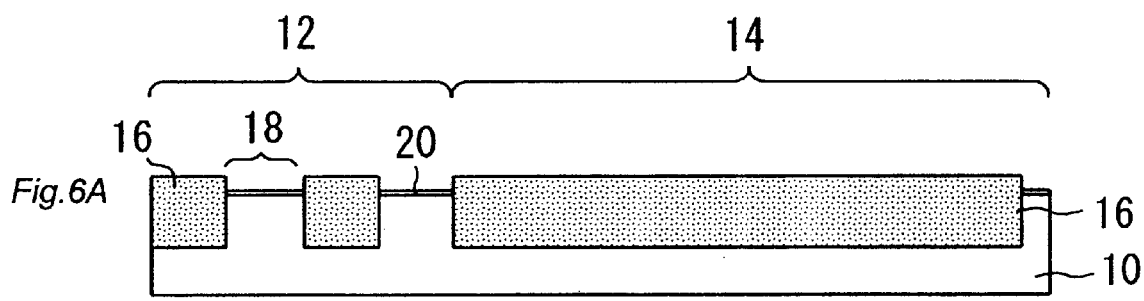
Figure 6B:
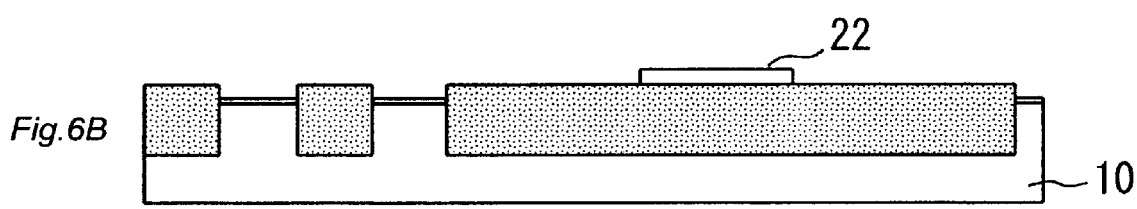
Figure 6C:
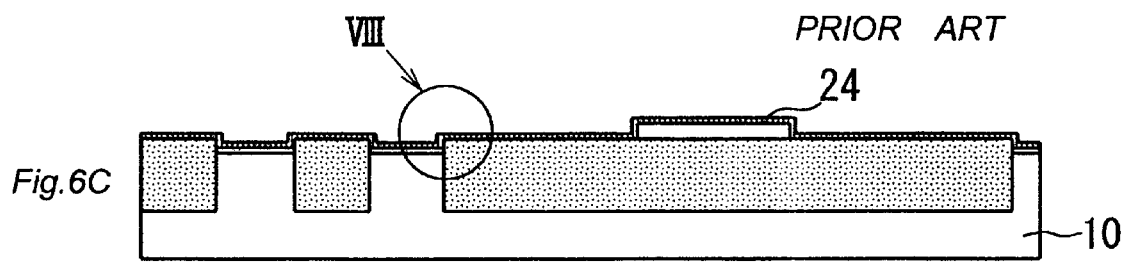
Figure 8A:
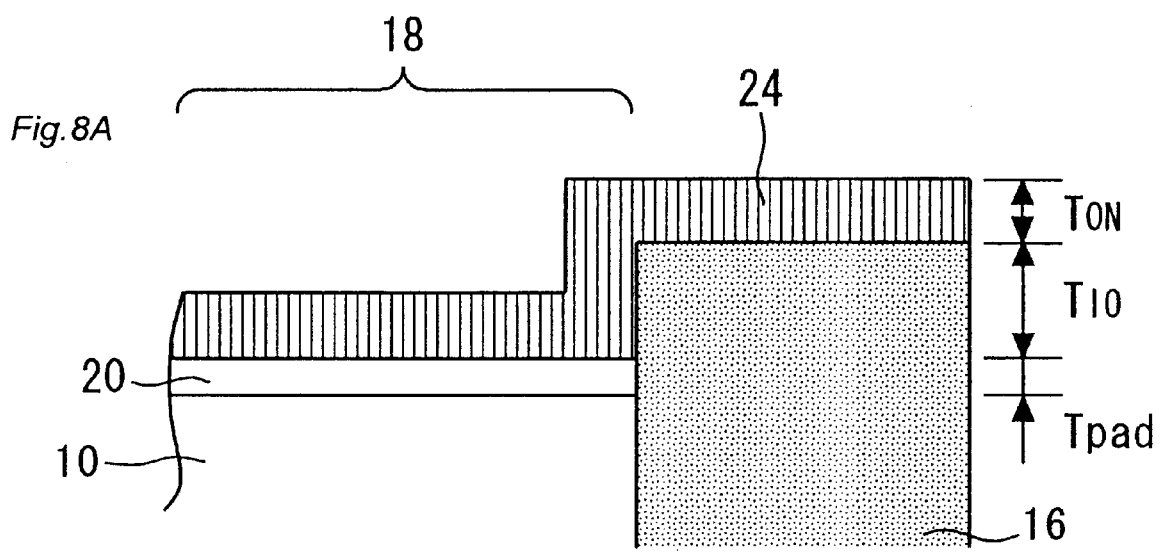
FIGS. 8A to 8C are cross-sectional views for describing problems involved in the conventional method.
Figure 8B:
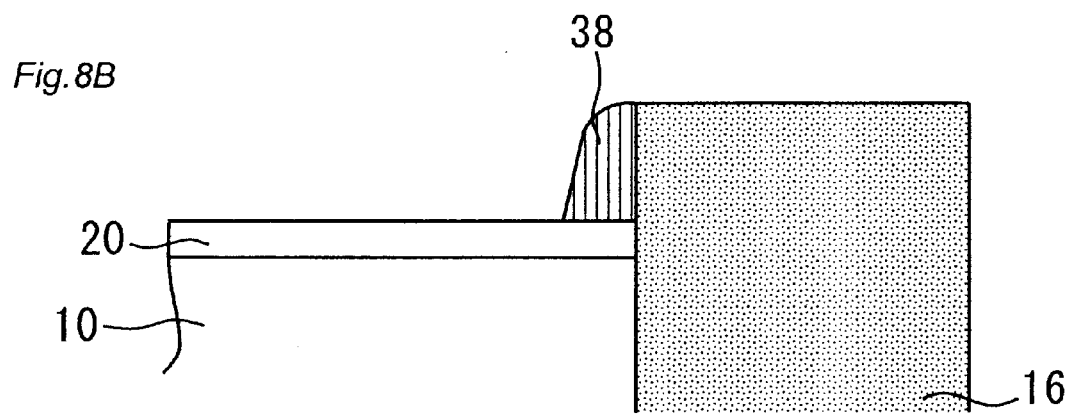
Figure 8C:
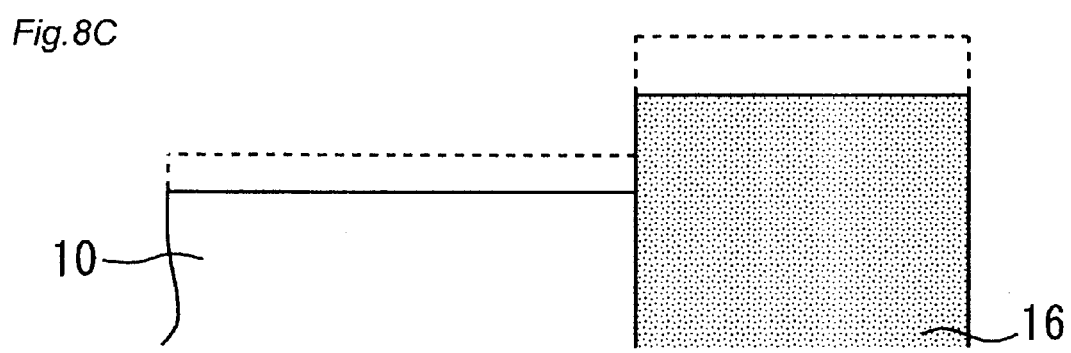

FIGS. 1A to 1C and FIGS. 2A to 2F are cross-sectional views for describing a method of manufacturing a semiconductor device according to an embodiment 1 of the present invention. As shown in the drawings, the silicon substrate 10 is divided into a transistor fabrication region 12 where a transistor is to be fabricated and a capacitor fabrication region 14 where a capacitor is to be fabricated. Processing which will be described by reference to FIGS. 1A to 1C is identical with that pertaining to the method of background art described by reference to FIGS. 6A through 6C.

The method of the present embodiment is suitable for manufacturing a system LSI equipped with a so-called poly-poly capacitor. Throughout the specification, the term "poly-poly capacitor" designates a capacitor which comprises upper and lower electrodes, both being formed from polysilicon, and an ONO film sandwiched between the upper and lower electrodes so as to act as a dielectric film. Further, the term "ONO film"designates a multilayered film comprising a silicon oxide film, a silicon nitride film, and a silicon oxide film, in the sequence given.

In the present embodiment, as shown in FIG. 1A, an isolation oxide film 16 is formed on the silicon substrate 10 by means of a so-called shallow-trench process. The isolation oxide film 16 is formed as a result of embedding an oxide film into shallow trenches formed in the silicon substrate 10. Within the transistor fabrication region 12, an active region 18 is formed in an area enclosed by the isolation oxide film 16. A pad oxide film 20 is formed on the surface of the active region 18 during the course of formation of the isolation oxide film 16.

As shown in FIG. 1B, a lower electrode 22 is formed from polysilicon in the capacitor fabrication region 14. During the process of forming the lower electrode 22, polysilicon is deposited on the silicon substrate 10 by means of the low-pressure CVD technique. Subsequently, the thus-deposited polysilicon is patterned into the shape of the lower electrode 22 by means of photolithography and dry etching.

As shown in FIG. 1C, an ON film 24; that is, a multilayered film comprising a silicon oxide film and a silicon nitride film, is formed on the lower electrode 22. During the process of forming the ON film 24, a silicon oxide film is grown over the upper surface of the lower electrode 22 or the entire surface of the silicon substrate 10, and a silicon nitride film is formed on the silicon oxide film. The silicon oxide film can be formed, for example, by means of thermally oxidizing the surface of polysilicon of the lower electrode 22 or through deposition of oxides by means of the low-pressure CVD technique while dichlorosilane ($SiH_2Cl_2$) and nitrous oxide ($N_2O$) are used as source materials. Further, the silicon nitride film can be formed, for example, through deposition of a nitride by means of the low-pressure CVD technique while dichlorosilane ($SiH_2Cl_2$) and ammonium ($NH_3$) are used as source materials.

The method of the present embodiment is characterized in that the ON film 24 formed as described above is patterned by means of wet etching. The characteristic of the method will be described by reference to FIGS. 2A through 2F.

As shown in FIG. 2A, a mask oxide film 40 is grown on the ON film 24. The mask oxide film 40 is an oxide film which is to turn into a mask for wet etching the ON film 24. The mask oxide film 40 can be formed, for example, through deposition of oxides by means of the low-pressure CVD technique while dichlorosilane ($SiH_2Cl_2$) and nitrous oxide ($N_2O$) are used as source materials, or through deposition of oxides by means of the low-pressure CVD while TEOS and oxygen ($O_2$) are used as source materials.

As shown in FIG. 2B, the mask oxide film 40 is patterned into such a geometry as to cover only the area in the vicinity of the lower electrode 22. The mask oxide film 40 is patterned by means of HF processing while a photoresist film 42 is taken as a mask; i.e., by means of wet etching. At this time, although the surface of the ON film 24 is exposed to HF, the nitride film covering the surface of the ON film 24 is less likely to be etched. Therefore, only the mask oxide film 40 can be selectively etched by means of wet etching. After completion of patterning of the mask oxide film 40, the photoresist film 42 is removed.

As shown in FIG. 2C, as a result of the wafer being subjected to wet etching while the mask oxide film 40 is used as a mask, the ON film 24 is patterned into such a geometry as to cover only the area in the vicinity of the lower electrode 22. The wet etching for patterning the ON film 24 is performed through use of hot phosphoric acid.

Wet etching through use of hot phosphoric acid enables selective removal of only a nitride film without removal of an oxide film; i.e., the isolation oxide film 16 and the pad oxide film 20. Further, the wet etching enables isotropic removal of a nitride film. Therefore, the foregoing wet etching enables patterning of the ON film 24 into an appropriate geometry without (1) imparting a damage to silicon of the active region 18; (2) involvement of recession of the upper surface of the isolation oxide film 16; and (3) an ON residue remaining in a border between the active region 18 and the isolation oxide film 16.

As shown in FIG. 2D, the mask oxide film 40 covering the ON film 24 and the pad oxide film 20 remaining in the active region 18 are removed by subjecting the entire surface of the silicon substrate 10 to wet etching through use of HF, after completion of patterning of the ON film 24. At this time, the ON film 24 is also exposed to HF after the removal of the mask oxide film 40. However, the nitride film covering the surface of the mask oxide film 40 is less likely to be etched through HF processing. Hence, only the mask oxide film 40 and the pad oxide film 20 can be selectively removed through the HF processing.

As shown in FIG. 2E, the gate oxide film 28 is formed on the surface of the active region 18. The gate oxide film 28 can be formed by thermal oxidation of the surface of the silicon substrate 10. At this time, the surface of the ON film 24; that is, the surface of a nitride film, is lightly oxidized, whereby the ON film 24 turns into an ONO film 30.

As shown in FIG. 2F, gate electrodes 32 are formed from polysilicon on the gate oxide film 28, and an upper electrode 34 is formed from polysilicon on the ONO film 30. These electrodes 32 and 34 are formed as a result of deposition of polysilicon on the entire surface of the silicon substrate 10 by means of the low-pressure CVD technique, and patterning of the polysilicon into a desired geometry through photolithography or dry etching. The gate electrode 32 and the upper electrode 34 may be formed from a multilayered film comprising tungsten silicide (WSi) and polysilicon.

A poly-poly capacitor 36 is fabricated in the capacitor fabrication region 14 as a result of the round of foregoing processing operations. Further, as a result of a source/drain region being formed in the active region 18 by means of the known technique, a transistor is fabricated in the transistor fabrication region 12.

Figure 3:
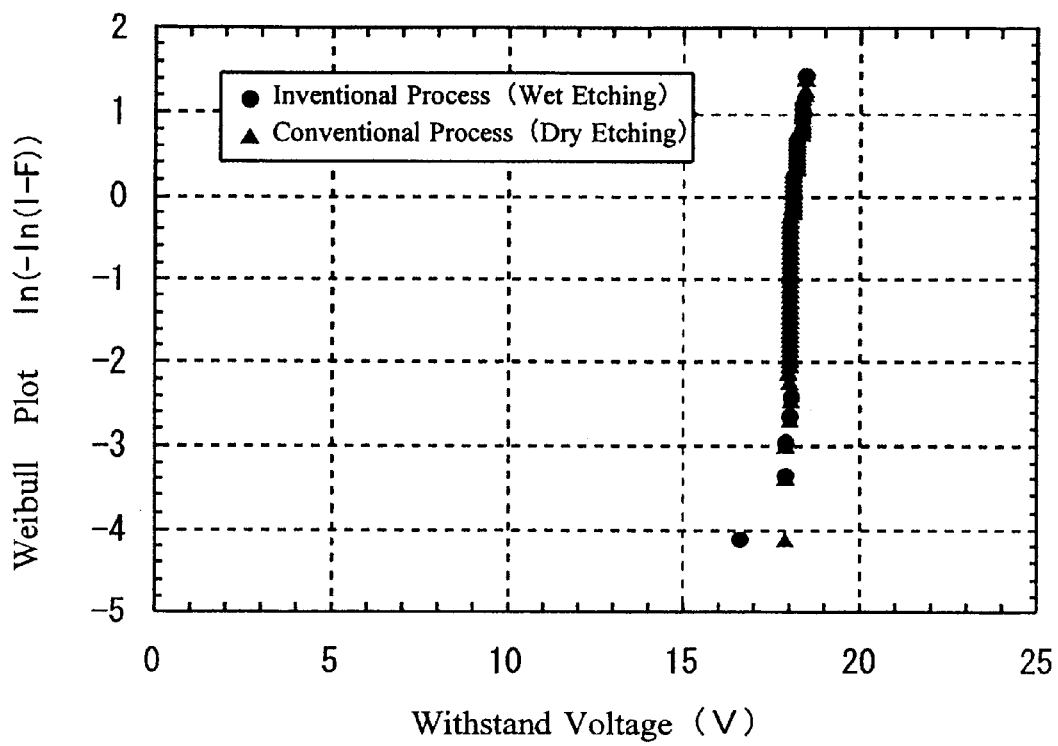
FIG. 3 is a chart showing the results of comparison between a poly-poly capacitor manufactured by the method of the first embodiment and a poly-poly capacitor manufactured by a conventional method, with regard to withstand voltage.

As mentioned above, under the method of the present embodiment, the ON film 24 is patterned by means of wet etching. In contrast, under the method of background art, the ON film 24 is patterned by means of dry etching. FIG. 3 is a chart showing the results of comparison between the poly-poly capacitor 36 fabricated by the method of the present embodiment and the poly-poly capacitor 36 fabricated by the method of background art, with regard to withstand voltage. The withstand voltage of the poly-poly capacitor 36 corresponds to a positive voltage which is applied across the upper electrode 34 to thereby induce within the capacitor 36 a leakage current exceeding a predetermined threshold value.

In FIG. 3, the horizontal axis represents the withstand voltage of the poly-poly capacitor 36, and the vertical axis represents a Weibull plot. Solid circles (●) shown in FIG. 3 represent the withstand voltages of the poly-poly capacitors fabricated by the method of the present embodiment, and solid triangles (▼) represent the withstand voltages of the poly-poly capacitors fabricated by the method of background art. As shown in FIG. 3, no significant difference is admitted to exist between the two types of plots; i.e., the solid circles (●) and the solid triangles (▼). Therefore, as in the case of the method of background art, the method of the present embodiment enables stable fabrication of the poly-poly capacitor 36 having superior withstand voltage characteristics.

Figure 4:
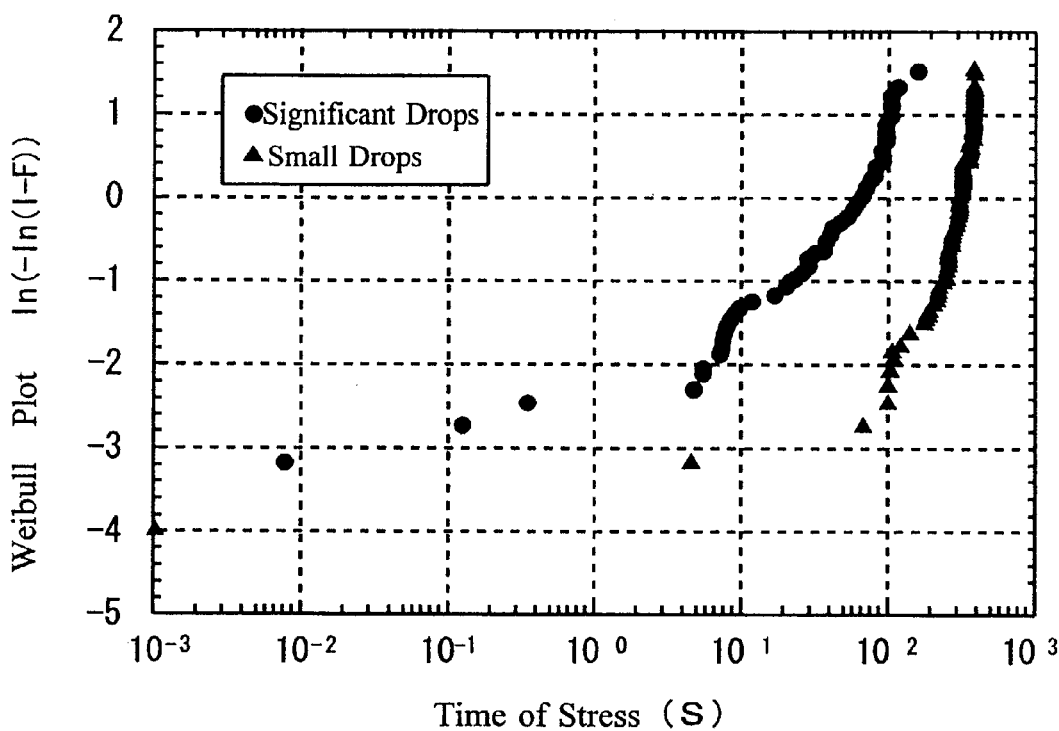
FIG. 4 is a chart showing a relationship between TDDB (time-dependent dielectric breakdown) characteristics of a gate oxide film and a height of a protuberance of an isolation oxide film.

As mentioned above, the method of the present embodiment including the wet etching step for patterning the ON film 24 enables fabrication of a transistor without involvement of recession of the upper surface of the isolation oxide film 16, which would otherwise be caused. FIG. 4 is a chart showing the relationship between TDDB (time-dependent dielectric breakdown) characteristics of the gate oxide film 28 and the height $T_{IO}$ of a protuberance of the isolation oxide film 16.

In FIG. 4, the horizontal axis represents time during which stress is applied to the gate oxide film 28, and the vertical axis represents a Weibull plot. Solid circles (4) shown in FIG. 4 correspond to cases where significant drops arise in the height $T_{IO}$ of the protuberance of the isolation oxide film 16, and solid triangles (▼) correspond to cases where small drops arise in the height $T_{IO}$ of the protuberance of the isolation oxide film 16. In FIG. 4, in contrast with the plots designated by solid triangles (▼), the plots designated by solid circles (●) are distributed with great variations in low withstand voltage characteristic. The distribution shows that the smaller the drop of the isolation oxide film 26, the better the TDDB characteristics of the gate oxide film 28; that is, the better the reliability of a transistor. Therefore, the method of the present embodiment is more effective for improving the reliability of a transistor than is the method of background art.

Figure 5:
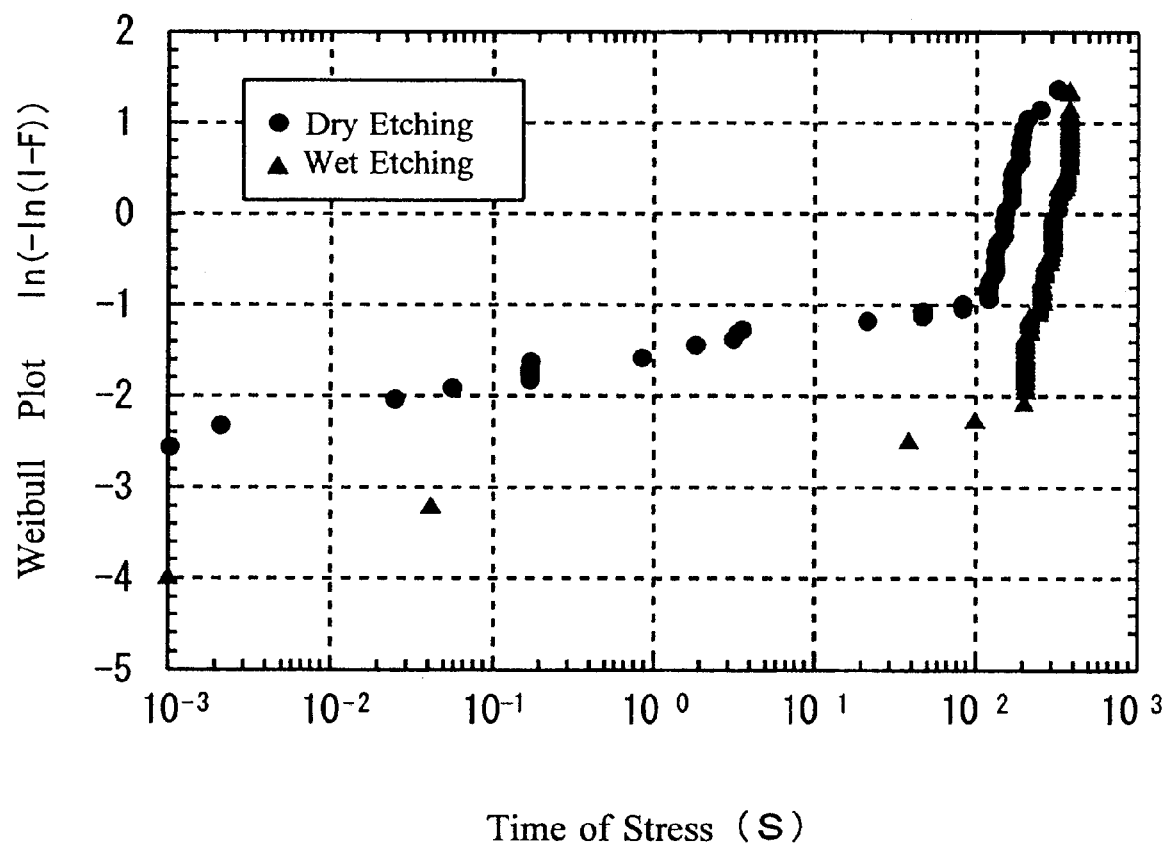
FIG. 5 is a chart showing the results of comparison between a poly-poly capacitor manufactured by the method of the first embodiment and a poly-poly capacitor manufactured by a conventional method, with regard to TDDB characteristics.

The method of the present embodiment enables fabrication of a transistor without imparting damage to silicon of the active region 18, since the ON film 24 is patterned by wet etching. FIG. 5 is a chart showing comparison between the TDDB characteristics of the gate oxide film 28 formed by the conventional method apt to impart damage to silicon and the TDDB characteristics of the gate oxide film 28 formed by the method of the present embodiment. The results shown in FIG. 5 are obtained through use of a pattern in which the influence of the height $T_{IO}$ of the protuberance belonging to the isolation oxide film 26 is negligible.

In FIG. 5, the horizontal axis represents the time during which stress is applied to the gate oxide film 28, and the vertical axis represents a Weibull plot. Solid circles (●) shown in FIG. 5 correspond to the method of background art, and solid triangles (▼) correspond to the method of the present embodiment. In FIG. 5, in contrast with the points designated by solid triangles (▼), the points designated by solid circles (●) are distributed with great variations in low withstand voltage characteristic. The distributions show that the gate electrode 28 formed by the method including patterning of the ON film 24 through wet etching is of higher quality than is the gate electrode 28 formed by the method involving patterning of the ON film 24 through dry etching, in terms of a TDDB characteristic; i.e., the reliability of a transistor.

The method of the present embodiment enables effective prevention of generation of ON residues, since the ON film 24 is patterned be wet etching. The method of the present embodiment enables manufacture of semiconductor devices of stable quality with high yield without involvement of generation of extraneous matters, which would cause failures of a semiconductor device.

Although in the present embodiment the isolation oxide film 16 protrudes from the active region 18 by a predetermined extent, the present invention is not limited to such an embodiment. The present invention can also be applied to a semiconductor device in which the isolation oxide film 16 does not protrude from the active region 18.

The major benefits of the present invention described above are summarized as follows:

According to the first aspect of the present invention, a silicon nitride film which is grown so as to cover a lower electrode can be patterned through wet etching. In this case, the silicon nitride film can be formed into the geometry of a dielectric film of a capacitor while the extent of etching of a pad oxide film and an isolation oxide film, both being covered with the silicon nitride film, is suppressed and without involvement of residual silicon nitride film. Further, the pad oxide film covering an active region is also removed through wet etching. Accordingly, the present invention enables fabrication of a transistor and a capacitor on a single substrate without imparting damage to silicon of the active region and without involvement of generation of extraneous matters, which would otherwise cause failures.

According to the second aspect of the present invention, a mask to be used for patterning a silicon nitride film can be formed from a silicon oxide film possessing superior resistance to hot phosphoric acid. Thus, the present invention enables patterning of a silicon nitride film by means of wet etching through use of hot phosphoric acid.

According to the third aspect of the present invention, a silicon oxide film can be patterned into the geometry of a mask through wet etching. As a result, a capacitor can be manufactured through only wet etching, thus completely preventing damage to the film, which would otherwise be induced by dry etching.

According to the fourth aspect of the present invention, both the silicon oxide film used as a mask and a pad oxide film covering the active region can be removed simultaneously in a single step. Thus, the present invention improves the productivity of a semiconductor device.

According to the fifth aspect of the present invention, an isolation oxide film is formed so as to protrude from an active region. Even in such a situation, the present invention enables appropriate patterning of a silicon nitride film without involvement of generation of a residue in a border between the active region and the isolation oxide film. The present invention enables manufacture of a semiconductor device having highly reliable transistors.

Further, the present invention is not limited to these embodiments, but variations and modifications may be made without departing from the scope of the present invention.

The entire disclosure of Japanese Patent Application No. Hei 11-328469 filed on Nov. 18, 1999 including specification, claims, drawings and summary are incorporated herein by reference in its entirety.

What is claimed is:

1. A method of manufacturing a semiconductor device comprising a transistor and a capacitor, both being formed in a single substrate, the method comprising the steps of:

forming an isolation oxide film on a silicon substrate so as to protrude from an active region of the silicon substrate by only a predetermined distance;

forming a pad oxide film on the active region of the silicon substrate;

forming a lower electrode of the capacitor on the isolation oxide film;

forming a silicon nitride film on entire surface of the silicon substrate so as to cover the lower electrode;

forming a mask on the silicon nitride film so as to cover only the area in the vicinity of the lower electrode;

patterning the silicon nitride film through use of the mask by means of wet etching capable of selectively removing a silicon nitride film without recession of an upper surface of the isolation oxide film;

removing the pad oxide film through wet etching capable of selectively removing silicon oxide, after patterning of the silicon nitride film;

forming a gate oxide film on the active region, after removal of the pad oxide film;

forming a gate electrode on the gate oxide film; and forming an upper electrode of the capacitor on the patterned silicon nitride film.

2. The method of manufacturing a semiconductor device according to claim 1, wherein the step of forming the mask comprises the sub-steps of:

growing a silicon oxide film on the silicon nitride film; and patterning the silicon oxide film into the geometry of the mask.

3. The method of manufacturing a semiconductor device according to claim 2, wherein the step of patterning the silicon oxide film into the geometry of the silicon oxide film comprises the sub-steps of:

forming a resist mask on the silicon oxide film; and wet etching the silicon oxide film through use of the resist mask and under conditions which enable selective removal of a silicon oxide film.

4. The method of manufacturing a semiconductor device according to claim 3, wherein the mask of the silicon oxide film is removed by wet etching for removing the pad oxide film.

5. The method of manufacturing a semiconductor device according to claim 2, wherein the mask of the silicon oxide film is removed by wet etching for removing the pad oxide film.

* * * * *